(12) United States Patent
Champion et al.

(10) Patent No.: US 9,141,154 B2
(45) Date of Patent: Sep. 22, 2015

(54) DATA COMMUNICATIONS AND POWER DISTRIBUTION IN A COMPUTER EQUIPMENT RACK

(75) Inventors: David F. Champion, Durham, NC (US); Karl K. Dittus, Durham, NC (US); John G. Gundlach, Cary, NC (US); Michael S. Miller, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 1892 days.

(21) Appl. No.: 11/936,108

(22) Filed: Nov. 7, 2007

(65) Prior Publication Data

US 2009/0116178 A1   May 7, 2009

(51) Int. Cl.
*G06F 1/18* (2006.01)
*H05K 7/14* (2006.01)

(52) U.S. Cl.
CPC .............. *G06F 1/189* (2013.01); *H05K 7/1492* (2013.01); *Y10T 29/5313* (2015.01)

(58) Field of Classification Search
CPC . H05K 7/1488; H05K 7/1492; H05K 7/1455; H05K 7/1457; G06F 1/263; G06F 1/189; Y10T 29/5313
USPC .................... 211/26, 189; 361/727, 610, 641, 361/679.48, 679.21, 601, 622, 626; 174/50, 174/59, 54
See application file for complete search history.

(56) References Cited

U.S. PATENT DOCUMENTS

| 5,301,346 | A | * | 4/1994 | Notarianni et al. ........... 700/267 |
| 5,788,087 | A |   | 8/1998 | Orlando |
| 6,452,805 | B1 |   | 9/2002 | Franz et al. |
| 6,516,954 | B2 | * | 2/2003 | Broome ............................ 211/26 |
| 6,564,571 | B2 | * | 5/2003 | Feeney ........................ 62/259.2 |
| 6,628,009 | B1 | * | 9/2003 | Chapel ............................. 307/14 |
| 6,796,506 | B1 | * | 9/2004 | Pradhan et al. ........... 235/462.13 |
| 6,826,036 | B2 |   | 11/2004 | Pereira |
| 6,870,095 | B1 | * | 3/2005 | Whitted ........................ 174/481 |
| 6,882,530 | B2 |   | 4/2005 | Cyphers et al. |
| 6,909,611 | B2 | * | 6/2005 | Smith et al. .................... 361/727 |
| 7,032,277 | B2 |   | 4/2006 | Rolla et al. |
| 7,055,833 | B2 | * | 6/2006 | Wixted et al. .............. 280/47.34 |
| 7,113,991 | B1 |   | 9/2006 | Miyamoto et al. |
| 7,187,265 | B1 | * | 3/2007 | Senogles et al. ............... 340/3.5 |
| 7,420,805 | B2 | * | 9/2008 | Smith et al. .............. 361/679.48 |
| 7,646,590 | B1 | * | 1/2010 | Corhodzic et al. ............ 361/641 |
| 7,898,117 | B2 | * | 3/2011 | Bousseton et al. ............ 307/156 |
| 8,238,080 | B2 | * | 8/2012 | McGinn ........................ 361/601 |
| 8,477,491 | B1 | * | 7/2013 | Ross et al. ................. 361/679.5 |
| 8,902,569 | B1 | * | 12/2014 | Wishman et al. ............. 361/622 |
| 2001/0026436 | A1 | * | 10/2001 | Tanzer et al. ................. 361/610 |
| 2002/0020682 | A1 | * | 2/2002 | Broome ............................ 211/26 |
| 2003/0223193 | A1 | * | 12/2003 | Smith et al. ................... 361/687 |
| 2003/0223196 | A1 | * | 12/2003 | Smith et al. ................... 361/687 |
| 2004/0000815 | A1 | * | 1/2004 | Pereira ............................ 307/11 |

(Continued)

*Primary Examiner* — Joshua Rodden
*Assistant Examiner* — Hiwot Tefera
(74) *Attorney, Agent, or Firm* — Edward J. Lenart; Katherine S. Brown; Kennedy Lenart Spraggins LLP (57) ABSTRACT

Methods and computer equipment racks configured for data communications and power distribution are disclosed that include a plurality of servers mounted horizontally, each server having a power distribution connection and one or more switch connections; one or more power distribution units ('PDUs') mounted vertically; and one or more network switches mounted vertically, each network switch comprising one or more rows of switch connections.

2 Claims, 5 Drawing Sheets

(56) References Cited

U.S. PATENT DOCUMENTS

| | | | |
|---|---|---|---|
| 2004/0264112 A1* | 12/2004 | Koehler et al. | 361/600 |
| 2005/0078422 A1* | 4/2005 | Pincu et al. | 361/62 |
| 2006/0116023 A1* | 6/2006 | Spitaels et al. | 439/532 |
| 2006/0139855 A1* | 6/2006 | Ewing et al. | 361/600 |
| 2008/0093927 A1* | 4/2008 | Ewing et al. | 307/23 |
| 2008/0106870 A1* | 5/2008 | Dully | 361/724 |
| 2009/0154159 A1* | 6/2009 | Graybill et al. | 362/249.02 |
| 2012/0087074 A1* | 4/2012 | Chen | 361/679.02 |

* cited by examiner

DATA COMMUNICATIONS AND POWER DISTRIBUTION IN A COMPUTER EQUIPMENT RACK

BACKGROUND OF THE INVENTION

1. Field of the Invention

The field of the invention is data processing, or, more specifically, methods and computer equipment racks for data communications and power distribution.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Many computer systems today can be mounted in a single rack. A rack may hold 12, 24, 48, or more, individual computer systems. Such computer systems require power to operate and are typically connected to other electronic devices through a network. Each power and network connection on a computer system installed in a rack typically requires a cable. Managing cables can be difficult as the number of individual computer system installed in a computer equipment rack increases. In some cases, for example, one computer rack may include 24 computer systems, each having three cables connected to various modules in the rack or another nearby rack. In typical racks each of the cables may need to be a different length. Having hundreds of varying-length cables increases the difficulty already present in managing cables for power and data communications in a rack.

SUMMARY OF THE INVENTION

Methods and computer equipment racks configured for data communications and power distribution are disclosed that include a plurality of servers mounted horizontally, each server having a power distribution connection and one or more switch connections; one or more power distribution units ('PDUs') mounted vertically; and one or more network switches mounted vertically, each network switch comprising one or more rows of switch connections.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
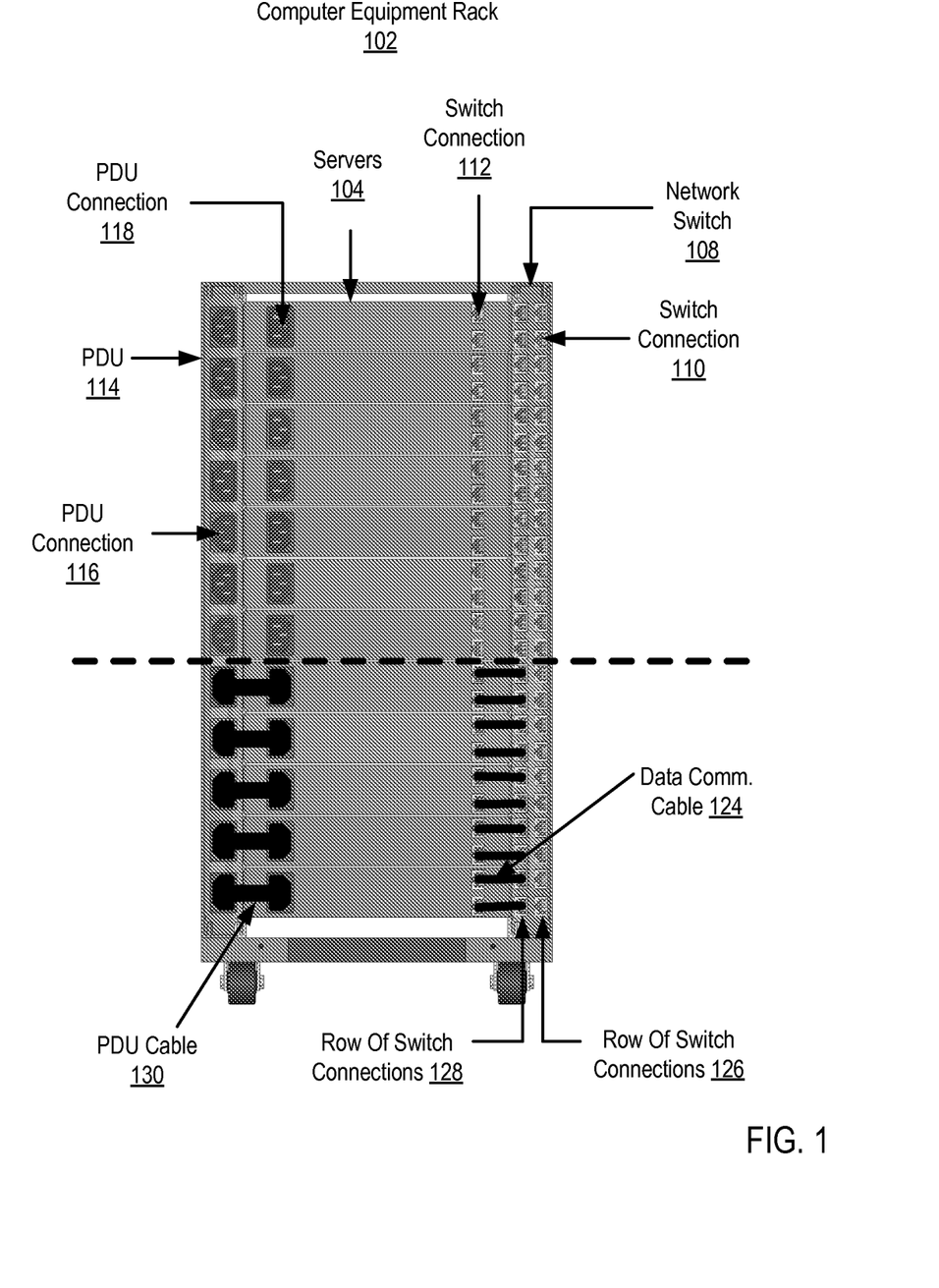
FIG. 1 sets forth a line drawing of an exemplary computer equipment rack configured for data communications and power distribution according to embodiments of the present invention.

Exemplary methods and computer equipment racks for data communications and power distribution in accordance with the present invention are described with reference to the accompanying drawings, beginning with FIG. 1. FIG. 1 sets forth a line drawing of an exemplary computer equipment rack (102) configured for data communications and power distribution according to embodiments of the present invention.

A computer equipment rack is a system for mounting various electronic modules in a stack. Some conventional computer equipment racks are 19 inches wide and are divided into subracks. Each subrack is typically measured in rack units. Each rack unit, designated as '1U,' is 1.75 inches in height. As an example, a typical rack may be a 19 inch, 24U rack, that is, 19 inches wide with 24, 1.75 inch high subracks. Typical computer equipment racks may include such electronic modules as servers, network switches, routers, power supplies, power distribution units, management modules, and other electronic modules as will occur to those of skill in the art. In typical computer equipment racks such electronic modules are only mounted horizontally.

The exemplary computer equipment rack (102) of FIG. 1 includes a plurality of servers mounted horizontally, one or more power distribution units ('PDUs') mounted vertically, and one or more network switches mounted vertically. In the computer equipment rack (102) of FIG. 1 each network switch includes two rows of switch connections (110). Although each network switch in the computer equipment rack of FIG. 1 includes two rows (126,128) of switch connections (110), readers of skill in the art will immediately recognize that a network switch useful in data communications and power distribution in accordance with embodiments of the present invention may include any number of rows of switch connections. Also in the computer equipment rack (102) of FIG. 1, each server has a power distribution connection (118) and two switch connections (112).

The exemplary computer equipment rack (102) of FIG. 1 is shown as a 19-inch, 12U rack for clarity, not for limitation. Readers of skill in the art will recognize that computer equipment racks useful in data communications and power distribution according to embodiments of the present invention may be implemented in many different configurations such, 19-inch, 24U, 48U, 72U racks, or the like.

The term 'server' typically refers to an application or device that performs services for connected clients as part of a client-server architecture. A server application is an application program that accepts connections in order to service requests by sending back responses. Server computers are devices designed to run such an application or applications, often for extended periods of time with minimal human direction. Examples of servers include web servers, e-mail servers, and file servers. In this specification the term "server" refers to a combination of a server application and a server computer.

A power distribution unit ('PDU') is a device that distributes electrical power. Large industrial power distribution units are typically used for distributing electrical current to a number of power outlets, such as for example, distributing 60 A electrical current to multiple power outlets. PDUs are used in computer data centers, stage shows, and in other electrically intensive applications. Some PDUs have features such as remote monitoring or control down to the individual plug level. In computer equipment racks, for example, computer network equipment and servers sometimes hang on configuration changes. A manageable PDU may enable the resetting of that computer network equipment or server over an RS-232 serial connection.

Power distribution connections (116), depicted as 'PDU connections' in FIG. 1, are AC electrical connector socket for connecting a PDU and a server or other electronic module. Such sockets may be implemented as any socket type according to the socket types described in *Electric Current Abroad* published in 2002 by the U.S. Department of Commerce International Trade Administration. A type-B socket for example, is a typical 3-pin, 15 A 125V socket used in North America.

A network switch is a computer networking device that connects network segments. Devices connected to the network switch may communicate with one other another through any data communications protocol as will occur to those of skill in the art, including, for example, TCP (Transmission Control Protocol), IP (Internet Protocol), HTTP (HyperText Transfer Protocol), WAP (Wireless Access Protocol), HDTP (Handheld Device Transport Protocol), and others. A network switch is typically capable of inspecting data packets from a networked entity as the data packets are received, determining the source and destination device of each packet, and forwarding each data packet to the appropriate destination device.

A switch connection as used in the application is a hardware port for connecting a network switch and a server. Such switch connections may include, for example, Ethernet ports, Fibre ports, Infiniband ports, and other as will occur to those of skill in the art. In the exemplary computer equipment rack (102) of FIG. 1, each of the servers and the network switch includes switch connections implemented as Ethernet ports for clarity only, not for limitation.

In the example of FIG. 1, the computer equipment rack (102) is separated into two portions by a dotted line. One portion of the computer equipment rack includes mounted equipment that connected for data communications and power distribution separated by the dotted line while the other portion of the computer equipment rack includes mounted equipment that is not connected for data communications and power distribution. The separation of the two portions is for clarity only, not for limitation. Readers of skill in the art will recognize that any equipment mounted in a computer equipment rack according to embodiments of the present invention may be connected for data communications and power distribution.

In the connected portion of the exemplary computer equipment rack (102) of FIG. 1, several of the servers (104) are connected to the network switch (108) via data communications cables (124) and several servers (104) are connected to the PDU (114) via PDU cables (130). In typical computer equipment racks such data communications cables and PDU cables are located in the rear of the computer equipment rack. In the computer equipment rack of FIG. 1, however, all power distribution and data communications connections in the computer equipment rack are front accessible. Although the computer equipment racks are described in this specification as being configured with front accessible PDU connections and data communications connections, readers of skill in the art will recognize that computer equipment racks configured for data communications and power distribution according to embodiments of the present invention may be configured with PDU connections and data communications connections located on the front or rear of the computer equipment rack in any combination. That is, a computer equipment rack according to embodiments of the present invention may be configured with any of the following:

front accessible data communications connections and rear accessible PDU connections;

rear accessible data communications connections and front accessible PDU connections;

rear accessible PDU and data communications connections; or front accessible PDU and data communications connections.

As mentioned above, the computer equipment rack of FIG. 1 may be implemented as a 12U, 24U, 48U rack and so on. In racks taller than the computer equipment rack of FIG. 1 more than one PDU and more than one network switch may be mounted. In such cases, power distribution units ('PDUs') may be implemented in one column and the network switches may be implemented in another column. That is, a number of PDUs may be mounted vertically in a single column and a number of network switches may also be mounted vertically in a single, separate column.

In the exemplary computer equipment rack (102) of FIG. 1, the distance from a PDU connection on a server to the nearest PDU connection on the PDU (114) in the computer equipment rack (102) of FIG. 1 is nearly the same for PDU connections on all the servers in the computer equipment rack of FIG. 1. All power distribution cables (130) used in connecting the PDU (114) to the servers (104) in the computer equipment rack (102) of FIG. 1 may be the same or nearly the same length. Using the same or nearly the same length cable to connect all servers in a computer equipment rack to a PDU, greatly reduces the number of different length cables used in power distribution in typical computer equipment racks.

In the exemplary computer equipment rack (102) of FIG. 1, the distance from a switch connection on a server to the nearest switch connection on the network switch (108) in the computer equipment rack (102) of FIG. 1 is nearly the same for switch connections on all the servers (104) in the computer equipment rack (102) of FIG. 1. All data communication cables (124) used in connecting the network switch (108) to the servers (104) in the computer equipment rack (102) of FIG. 1 may be the same or nearly the same length. Using the same or nearly the same length cable to connect all servers in a computer equipment rack to a network switch, greatly reduces the number of different length cables used in data communications distribution in typical computer equipment racks.

The arrangement of servers and other devices making up the exemplary computer equipment rack (102) illustrated in FIG. 1 are for explanation, not for limitation. Computer equipment racks configured for data communications and power distribution according to various embodiments of the present invention may include additional servers, routers, and other devices not shown in FIG. 1, as will occur to those of skill in the art. Networks in such computer equipment racks may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
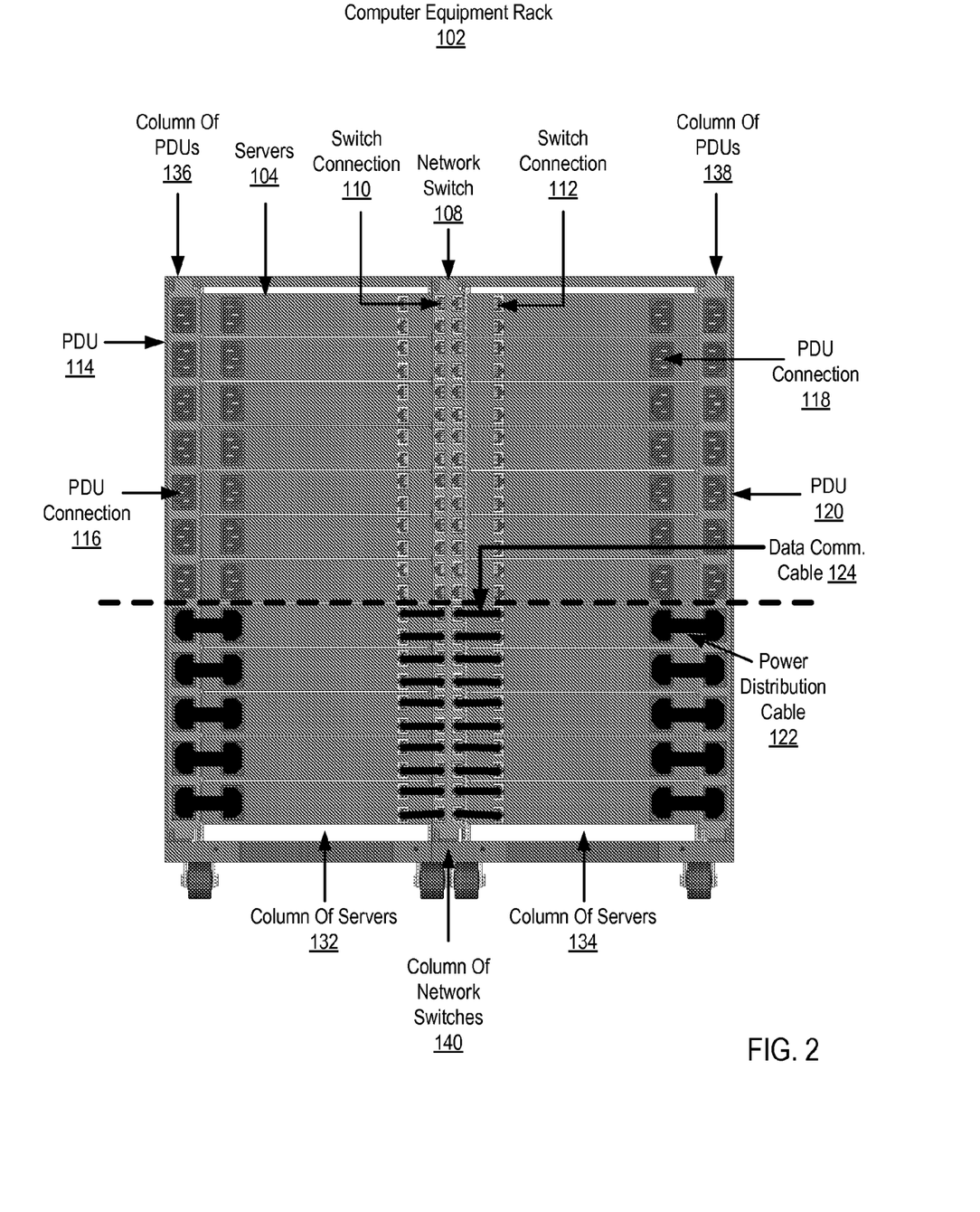
FIG. 2 sets forth a line drawing of a further exemplary computer equipment rack configured for data communications and power distribution according to embodiments of the present invention.

For further explanation FIG. 2 sets forth a line drawing of a further exemplary computer equipment rack (102) configured for data communications and power distribution according to embodiments of the present invention. The exemplary computer equipment rack (102) of FIG. 2 is similar to the computer equipment rack of FIG. 1 in that the computer equipment rack (102) of FIG. 2 also includes a plurality of servers (104) mounted horizontally, one or more PDUs mounted vertically, and one or more network switches (108) mounted vertically.

The computer equipment rack (102) of FIG. 2 differs from the computer equipment rack of FIG. 1, however, in that in the computer equipment rack (102) of FIG. 2, the plurality of servers (104) mounted horizontally include the servers in two columns (132, 134) with servers in one column upside-down with respect to the servers in another column. In the exemplary computer equipment rack (102) of FIG. 2, the power distribution connection (118) and the one or more switch connections (112) on all the servers are located in the same relative locations on the servers. Although the computer equipment rack of FIG. 2 is configured with many nearly identical servers, readers of skill in the art will recognize that many different types of servers may be installed in a computer equipment rack in accordance with embodiments of the present invention. In that case, groups of servers of the same type having PDU connections and switch connections in the same relative locations will require cables having the same, or nearly the same, length.

Also in the computer equipment rack (102) of FIG. 2, the power distribution units ('PDUs') and the network switches mounted vertically include the PDUs in two columns (136, 138) with the columns (132,134) of servers between the two columns of PDUs and the network switches (108) in a column (140) between the columns of servers. Because one of the column of servers (132,134) in the computer equipment rack of FIG. 2 is mounted upside-down with respect to the other column of servers, the PDU connections for the two columns of servers are located on the outside of the computer equipment rack, while the switch connections for each of the servers in the two columns of servers are located in the middle of the computer equipment rack. In this configuration it may be possible to reduce the total number sets of cables having different lengths to two: one set of same-length data communications cables (124) and one set of same-length power distribution cables (122).

Figure 3A:
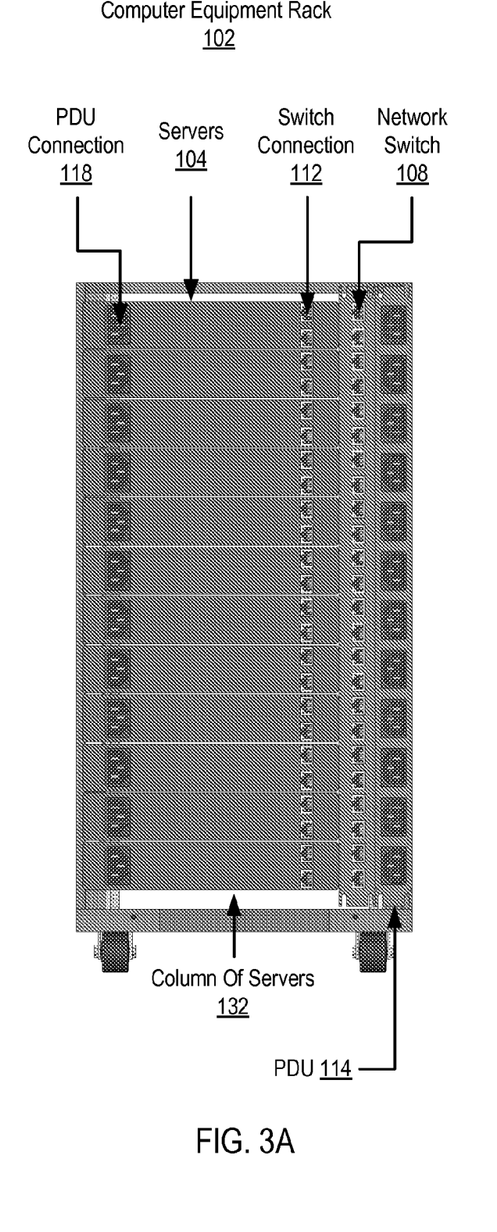
FIG. 3A sets forth a line drawing of a further exemplary computer equipment rack for data communications and power distribution according to embodiments of the present invention.

For further explanation FIG. 3A sets forth a line drawing of a further exemplary computer equipment rack (102) for data communications and power distribution according to embodiments of the present invention. The exemplary computer equipment rack (102) of FIG. 3A is similar to the computer equipment rack of FIG. 1 in that the computer equipment rack (102) of FIG. 3A also includes a plurality of servers (104) mounted horizontally, one or more PDUs mounted vertically, and one or more network switches (108) mounted vertically. The exemplary computer equipment rack (102) of FIG. 3A differs from the computer equipment rack of FIG. 1, however, in that in the exemplary computer equipment rack (102) of FIG. 3A, the plurality of servers (104) mounted horizontally includes the servers in one or more columns (132) with all servers having the same orientation. The power distribution connection (118) and the one or more switch connections (112) on all the servers (104) in the exemplary computer equipment rack (102) of FIG. 3 are in same relative locations on the servers (104).

Also in the exemplary computer equipment rack (102) of FIG. 3A, the PDUs (114) and the network switches (108) mounted vertically include the PDUs in one or more columns and the network switches in one or more columns. Each column of PDUs is located on one side of a column (132) of servers (104) and each column of network switches is located on the same side of the column of servers as the column of PDUs. In the exemplary computer equipment rack (102) of FIG. 3A, for example, the network switch (108) is located and between the column of servers (132) and the vertically mounted PDU (114).

Figure 3B:
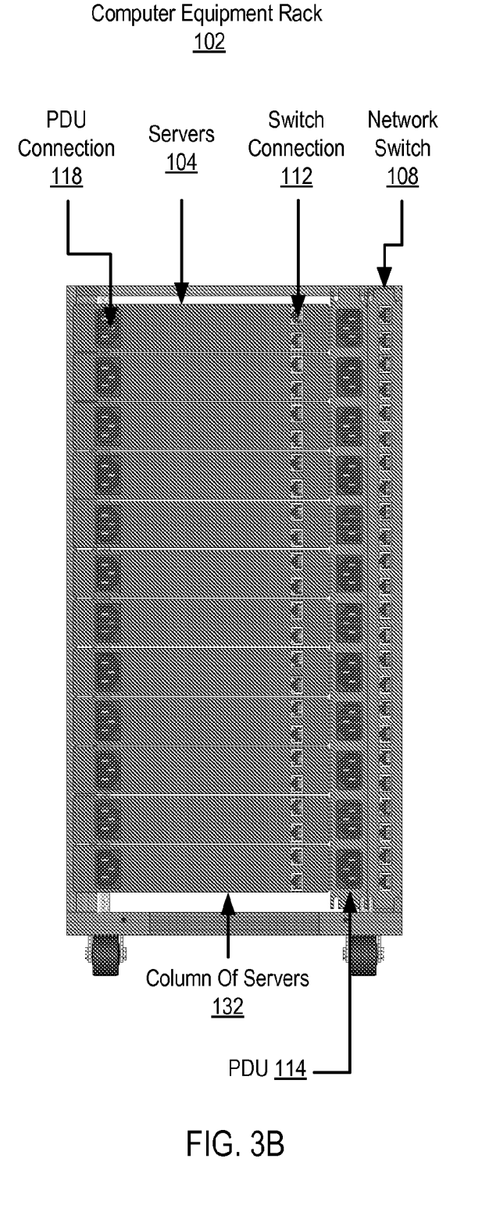
FIG. 3B sets forth a line drawing of a further exemplary computer equipment rack for data communications and power distribution according to embodiments of the present invention.

For further explanation FIG. 3B sets forth a line drawing of a further exemplary computer equipment rack (102) for data communications and power distribution according to embodiments of the present invention. The computer equipment rack (102) of FIG. 3A is similar to that of 3B in that in the exemplary computer equipment rack (102) of FIG. 3B, the plurality of servers (102) mounted horizontally includes the servers (102) in one or more columns (132) with all servers (104) having the same orientation, the PDUs (114) and the network switches (108) mounted vertically include the PDUs in one or more columns, each column of PDUs on one side of a column of servers; and the network switches in one or more columns, each column of network switches on the same side of the column of servers as the column of PDU. The exemplary computer equipment rack (102) of FIG. 3B differs from the computer equipment rack of FIG. 3A, however, in that the PDU (114) in the exemplary computer equipment rack of FIG. 3B is located between the column (132) of servers (104) mounted horizontally and the vertically mounted network switch (108).

Figure 4:
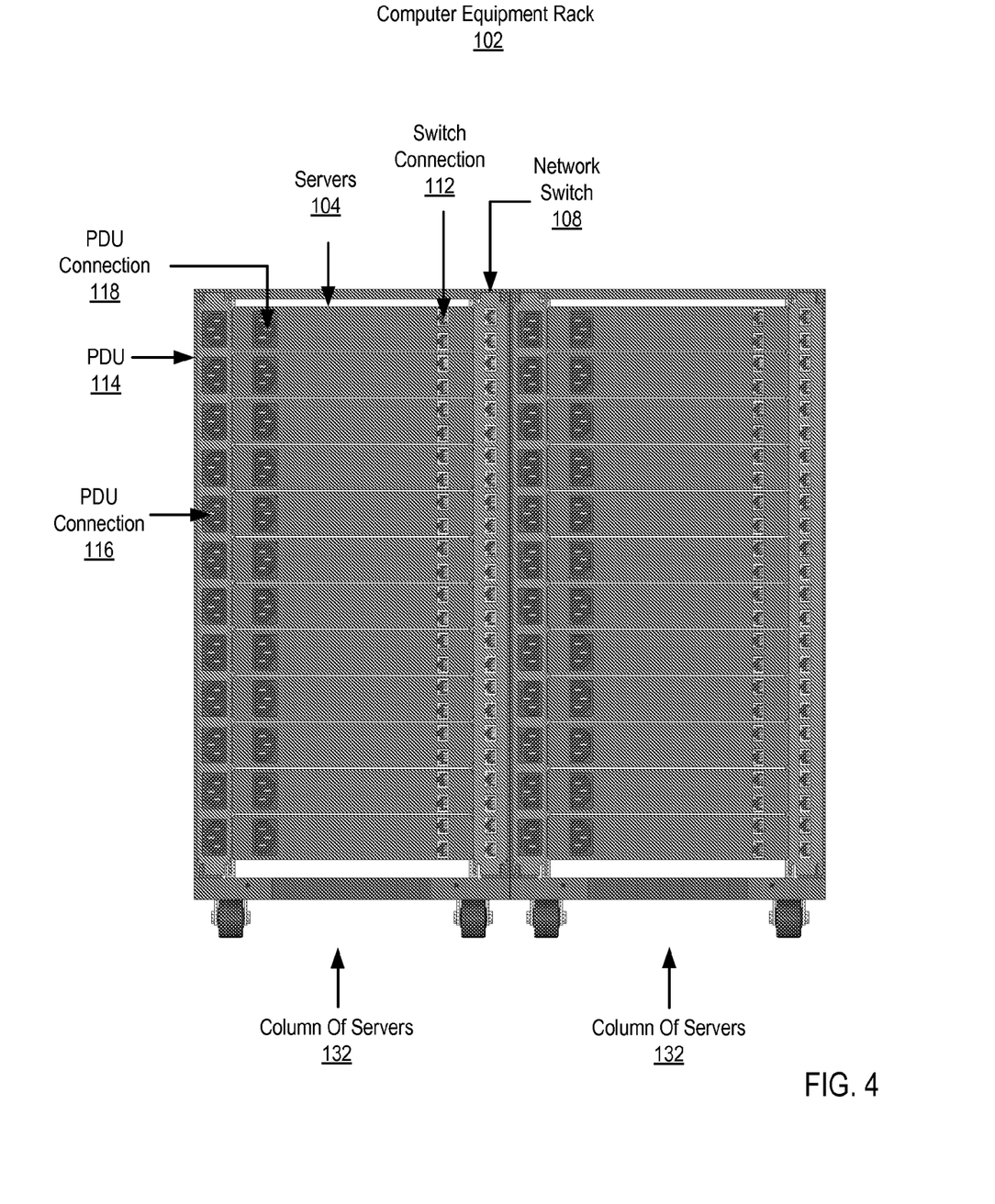
FIG. 4 sets forth a line drawing of a further exemplary computer equipment rack for data communications and power distribution according to embodiments of the present invention.

For further explanation FIG. 4 sets forth a line drawing of a further exemplary computer equipment rack (102) for data communications and power distribution according to embodiments of the present invention. The exemplary computer equipment rack (102) of FIG. 4 is similar to the computer equipment rack of FIG. 1 in that the computer equipment rack (102) of FIG. 4 also includes a plurality of servers (104) mounted horizontally, one or more PDUs mounted vertically, and one or more network switches (108) mounted vertically.

The exemplary computer equipment rack (102) of FIG. 4 differs from the computer equipment rack of FIG. 1, however, in that in the exemplary computer equipment rack (102) of FIG. 4, the plurality of servers (104) mounted horizontally includes the servers in one or more columns (132) with all the servers having the same orientation. In the exemplary computer equipment rack (102) of FIG. 4, the power distribution connection (118) and the one or more switch connections (112) on all the servers (104) are located in the same relative locations on the servers (104).

The exemplary computer equipment rack (102) of FIG. 4 also differs from the computer equipment rack of FIG. 1, in that in the exemplary computer equipment rack (102) of FIG. 4, the one or more PDUs (114) and the one or more network switches (108) mounted vertically includes the PDUs (114) in one or more columns and the network switches (108) in one or more columns. Each column (132) of servers (104) in the computer equipment rack (102) of FIG. 4 is located between one column of PDUs (118) and one column of network switches (108).

Figure 5:
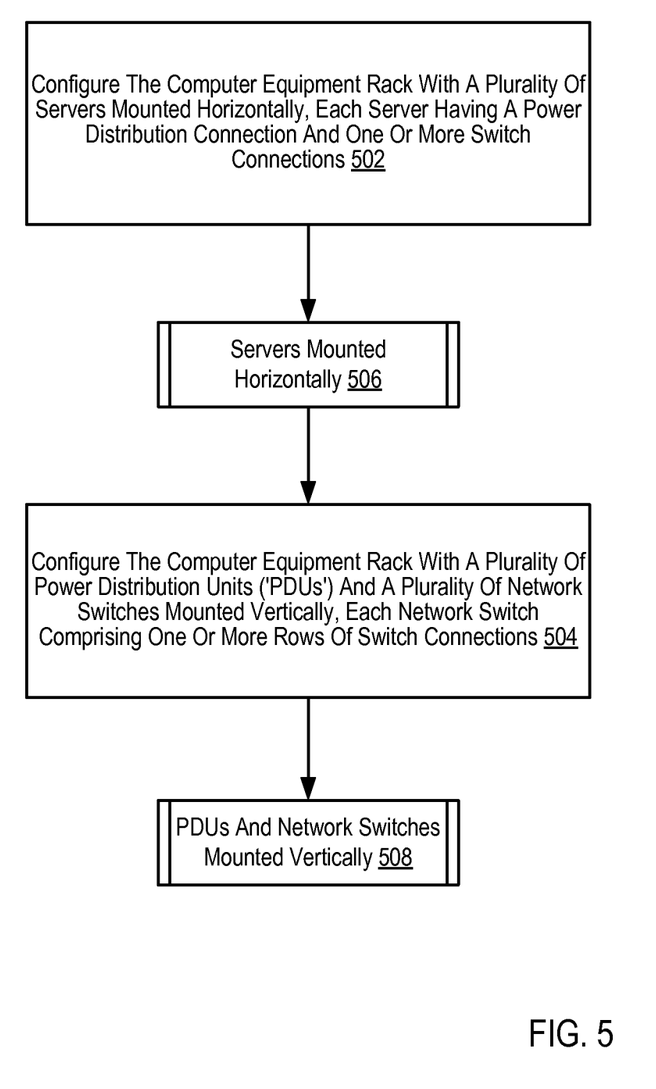
FIG. 5 sets forth a flow chart illustrating an exemplary method of data communications and power distribution in a computer equipment rack according to embodiments of the present invention.

For further explanation, FIG. 5 sets forth a flow chart illustrating an exemplary method of data communications and power distribution in a computer equipment rack according to embodiments of the present invention. The method of FIG. 5 includes configuring (502) the computer equipment rack with a plurality of servers mounted horizontally (506), each server having a power distribution connection and one or more switch connections; and configuring (504) the computer equipment rack with one or more PDUs and one or more network switches mounted vertically (508), each network switch comprising one or more rows of switch connections.

Configuring (502) the computer equipment rack with a plurality of servers mounted horizontally (506), and configuring (504) the computer equipment rack with one or more PDUs and one or more network switches mounted vertically (508) may be carried out in a number of ways. Configuring (502) the computer equipment rack with a plurality of servers mounted horizontally (506), and configuring (504) the computer equipment rack with one or more PDUs and one or more network switches mounted vertically (508) may be carried out, for example, by configuring the computer equipment rack with the PDUs in one column and the network switches in another column.

Configuring (502) the computer equipment rack with a plurality of servers mounted horizontally (506), and configuring (504) the computer equipment rack with one or more PDUs and one or more network switches mounted vertically (508) may also be carried out by configuring the plurality of servers in two columns with servers in one column upside-down with respect to the servers in another column, the power distribution connection and the one or more switch connections on all the servers in the same relative locations on the servers; configuring the PDUs in two columns with the columns of servers between the two columns of PDUs; and configuring the network switches in a column between the columns of servers.

Configuring (502) the computer equipment rack with a plurality of servers mounted horizontally (506), and configuring (504) the computer equipment rack with one or more PDUs and one or more network switches mounted vertically (508) may also be carried out by configuring the servers in one or more columns with all servers having the same orientation, the power distribution connection and the one or more switch connections on all the servers in the same relative locations on the servers; configuring the PDUs in one or more columns, each column of PDUs on one side of a column of servers; and configuring the network switches in one or more columns, each column of network switches on the same side of the column of servers as the column of PDUs.

Configuring (502) the computer equipment rack with a plurality of servers mounted horizontally (506), and configuring (504) the computer equipment rack with one or more PDUs and one or more network switches mounted vertically (508) may also be carried out by configuring the servers in one or more columns with all the servers having the same orientation, the power distribution connection and the one or more switch connections on all the servers in the same relative locations on the servers; configuring the PDUs in one or more columns; and configuring the network switches in one or more columns, each column of servers between one column of PDUs and one column of network switches.

In view of the explanations set forth above, readers will recognize that the benefits of data communications and power distribution in a computer equipment rack according to embodiments of the present invention include:

Reducing the number of power distribution cables having different length in a computer equipment rack;

Reducing the number of data communications cables having different length in a computer equipment rack; and Increasing the administration of such data communications and power distribution in a computer equipment rack by making the power distribution and switch connections front-accessible.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A computer equipment rack, the computer equipment rack comprising:
   a plurality of servers mounted horizontally, each server having a power distribution connection and one or more switch connections, the plurality of servers in two columns with servers in one column upside-down with respect to the servers in another column, the power distribution connection and the one or more switch connections on all the servers in the same relative locations on the servers;
   one or more columns comprising a plurality of power distribution units ('PDUs') mounted vertically on top of each other, the PDUs in two columns with the columns of servers between the two columns of PDUs; and
   one or more additional columns comprising a plurality of network switches mounted vertically on top of each other in one or more columns, each network switch comprising one or more rows of switch connections, each network switch mounted in the computer equipment rack separately from the plurality of servers and separately from the PDUs, the network switches in a column between the columns of servers,
   wherein the one or more columns comprising the plurality of PDUs are separate from the one or more additional columns comprising the plurality of network switches.

2. The computer equipment rack of claim 1 wherein all power distribution and data communications connections in the computer equipment rack are front accessible.

* * * * *